United States Patent [19]

Komatsuzaki

[11] Patent Number: 4,823,480
[45] Date of Patent: Apr. 25, 1989

[54] SEMICONDUCTOR HEAT-TREATING APPARATUS

[75] Inventor: Yasuo Komatsuzaki, Ibaraki, Japan

[73] Assignee: Texas Instruments Incorporated, Dallas, Tex.

[21] Appl. No.: 19,453

[22] Filed: Feb. 26, 1987

[30] Foreign Application Priority Data

Mar. 6, 1986 [JP] Japan .................................. 61-49203

[51] Int. Cl.$^4$ .............................................. F26B 3/06
[52] U.S. Cl. ..................................... 34/218; 432/125; 34/38
[58] Field of Search ...................... 34/22, 36, 38, 218; 432/6, 10, 125, 142, 144, 145, 241, 243

[56] References Cited

U.S. PATENT DOCUMENTS

| 4,223,450 | 9/1980 | Rothchild | 34/36 |
| 4,318,749 | 3/1982 | Mayer | 34/22 |
| 4,439,146 | 3/1984 | Sugita | 432/6 |
| 4,518,349 | 5/1985 | Tressler et al. | 432/239 |
| 4,597,736 | 7/1986 | Moffat | 34/36 |
| 4,610,628 | 9/1986 | Mizushina | 432/6 |

Primary Examiner—Henry A. Bennet
Attorney, Agent, or Firm—William E. Hiller; N Rhys Merrett; Melvin Sharp

[57] ABSTRACT

A semiconductor heat-treating apparatus comprising a heat treatment furnace main, gas discharging means surrounding the port for carrying semiconductors into or out of said furnace main therethrough, an internal cylindrical partition of said gas discharging means, said internal cylindrical partition engaging fittedly with said port for semiconductors, said gas discharging means being provided with a gas-stream forming system for discharging gases and a second gas-stream forming system for supplying inert gas into said cylindrical partition on the one side thereof and allowing the inert gas together with the gases from said furnace main to exit therefrom.

7 Claims, 3 Drawing Sheets

SEMICONDUCTOR HEAT-TREATING APPARATUS

BACKGROUND OF THE INVENTION

1. Field of the Invention

The present invention relates to a semiconductor heat-treating apparatus, particularly an impurity diffuser.

2. Description of the Prior Art

So far is known vertical type diffusers as apparatus for subjecting semiconductor wafers to impurity diffusing treatment. Such a prior art diffuser is illustrated in FIGS. 1 and 2, which has a diffusing furnace 9 consisting of a furnace-core tube 1 (referred to as core tube hereinafter) and an electric furnace 2 for heating the core tube. A number of semiconductor substrates 3 are loaded on a boat 4 supported by a shaft 5 and carried into or out of the furnace-core tube. Besides, there is provided a box-shaped scavenger 6 surrounding the upper-opening 10 of the core tube 1 through which the semiconductors are carried into or out. The scavenger 6 has on one side an outlet 7 for discharging air, reaction gas and diffusion gas 11 and on the other side apertures 8 for allowing air 12 to flow in.

In the apparatus, the wall of scavenger 6 receives radiant energy from the heater 2 extending to the vicinity of the core tube opening 10, becomes temperature-elevated. When semiconductor substrates 3 are carried into the furnace 9 through the scavenger 6, they are heated by the temperature-elevated wall and exposed to air from the outside air. When they are being carried into core tube 1, undesirable air such as air 13 present between semiconductor substrates arrayed and entrained outside air 13 are introduced into the interface between the semiconductor substrate 3 and oxide film on the surface thereof, with the result of formation of film of incomplete combination with oxygen, accompanied by increase in the interfacial charge density resulting from the incomplete oxidation. In addition to the deterioration of semiconductor element properties, there is problem with contamination of outside air.

OBJECTS AND SUMMARY OF THE INVENTION

An object of the present invention is to provide a semiconductor heat-treating apparatus which does not allow any impure gases such as outside air to invade and thus satisfactorily prevented from adverse influence by them.

A semiconductor heat-treating apparatus, particularly diffuser, according to the invention, which has achieved the above-mentioned object, is characterized in comprising a heat treatment furnace main such as furnace-core tube, gas discharging means such as box-shaped scavenger surrounding the port for carrying semiconductors into or out of the furnace main, the port being such as an opening of the core tube, an internal tubular partition of the gas discharging means, the internal cylindrical partition engaging fittedly with the port for semiconductors, such as the later-described circular cylindrical partition, the gas discharging means being provided with a gas-stream forming system, for example, consisting of an air inlet and an air outlet, and preferably, a second gas-stream forming system for supplying inert gas into the cylindrical partition on the one side thereof concurrently to the gas stream, and allowing the inert gas together with the gases from the furnace main to exit therefrom, the second gas-stream forming system, for instance, including inert gas spouts on one side of the cylindrical partition and gas exiting orifices allowing gases to pass out therefrom on the opposite side.

DESCRIPTION OF THE PREFERRED EMBODIMENTS

Figure 1:
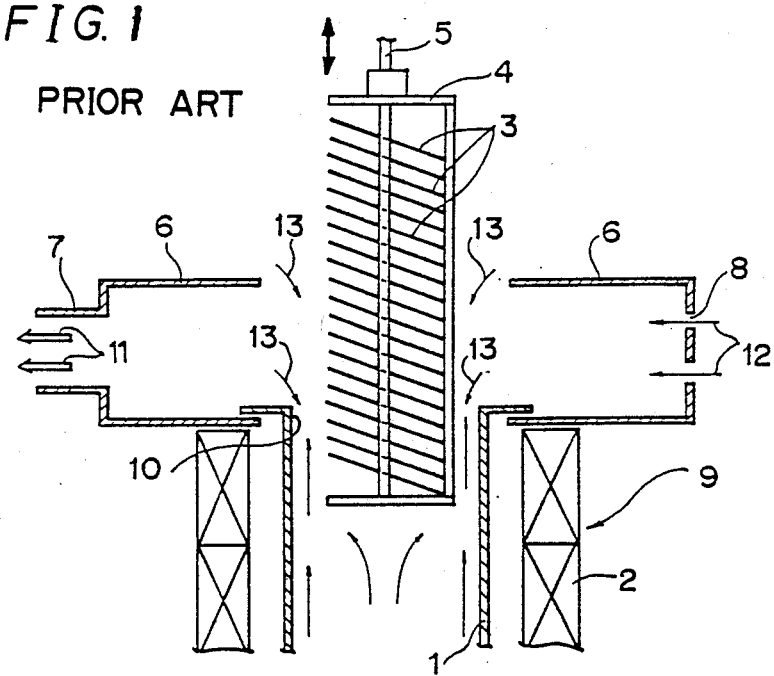
FIG. 1 is a cross-sectional view of a prior art vertical type diffuser illustrated in schematic way.
Figure 2:
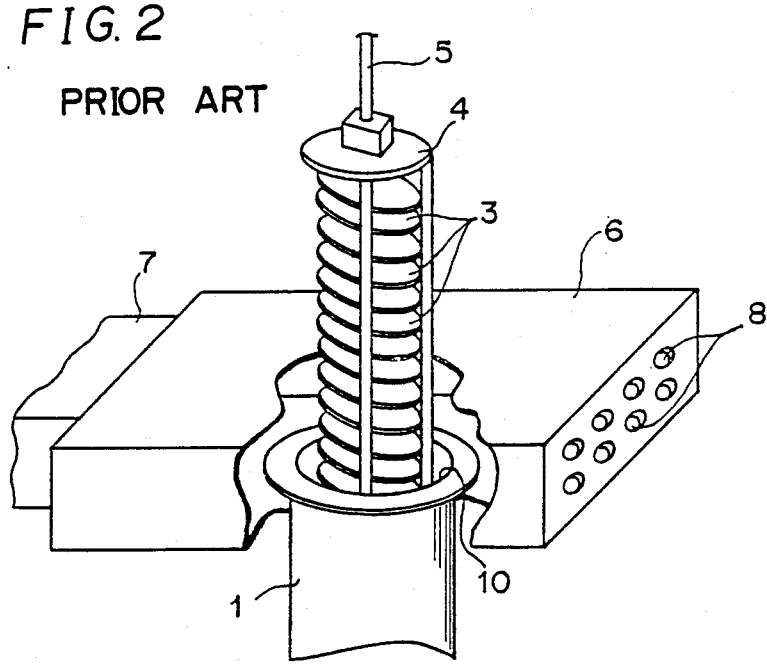
FIG. 2 is a perspective partially-broken view of the same.
Figure 3:
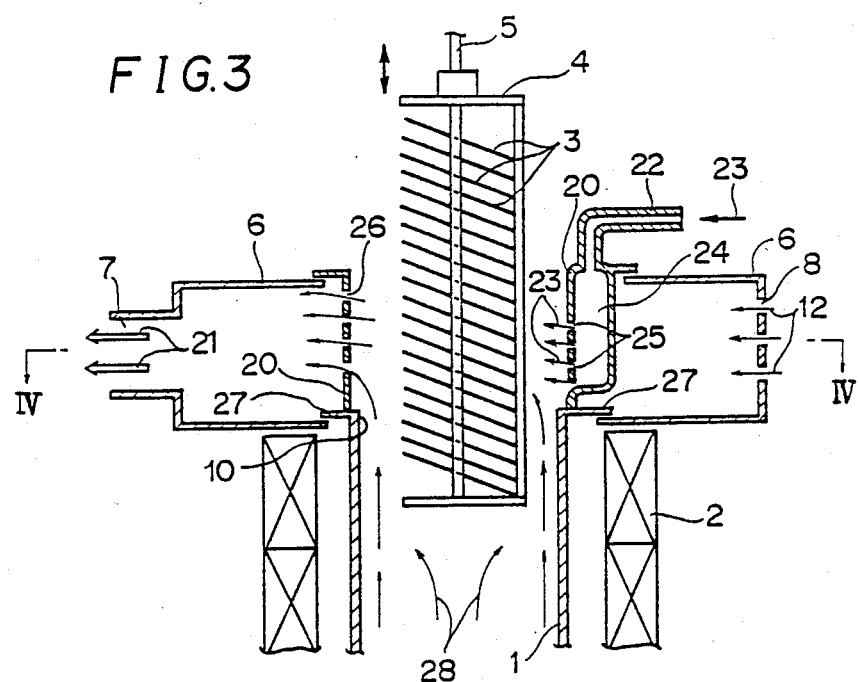
FIG. 3 is a cross-sectional view of a vertical type diffuser according to the invention illustrated in schematic way.
Figure 4:
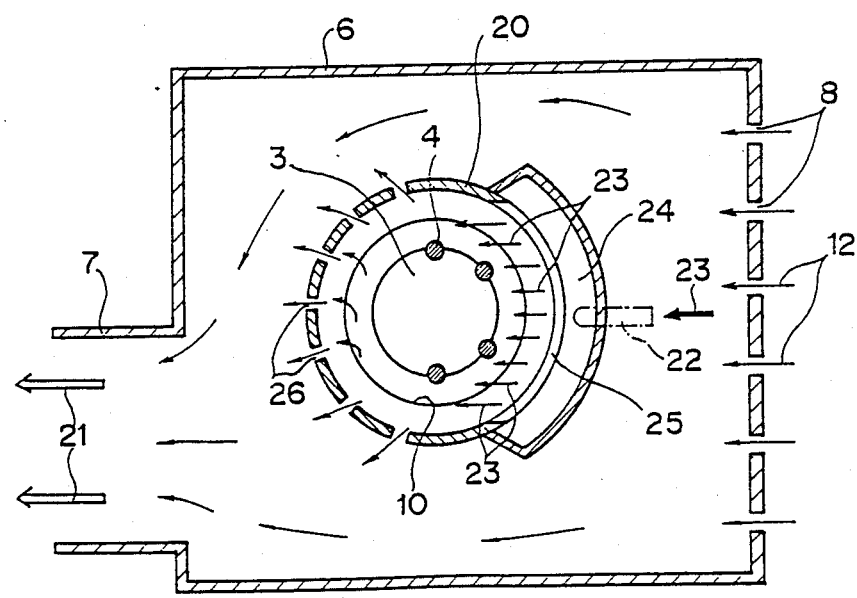
FIG. 4 is a cross-sectional view taken along line IV—IV of FIG. 3.

An embodiment of impurity diffuser according to the invention will be in detail with reference to the accompanying drawings hereinafter:

In FIGS. 3–6 illustrating an embodiment of vertical type diffuser in accordance with the invention, the corresponding parts or components to those shown in FIGS. 1 and 2 are designated by the same reference numerals, and their explanation are therefore omitted below.

In the apparatus according to the invention, the scavenger 6 is provided therein with a cylindrical (especially transparent quartz-made) partition 20 fitted on flange 27 of the opening 10 of the core tube 1. Inert gas 23 such as $N_2$ is inducted via a conduit 22 in an inert gas chamber 24 and injected therefrom through a plurality of slits 25 thereof to form inert gas curtain towards wafers 3. The injected inert gas 23 is sucked out through a plurality of orifices 26 on the opposite side and discharged through the air/gas outlet 7 from the scavenger 6. Once semiconductor wafers have been inserted, injection of inert gas 23 begins. During the injection, the suction effect through the gas exiting orifices 26 is higher when the air inlet 8 becomes closed. This is more favorable for preventing the tendency of the above-mentioned air 13 to flow into the core tube 1. Inert gas or purge gas 28 is injected into core tube upwards from the bottom to fill the space between the inserted wafers and the core tube and, together with the above-mentioned inert gas 23, passes through the gas exiting orifices 26. For permitting smooth gas streams, the inert gas chamber 24 is disposed on the side of the air inlet 8, and the gas exiting orifices 26, on the side of the air/gas outlet 7. Besides the wafers 3 are positioned to tilt down towards the inert gas chamber 24 and up towards the gas exiting orifices 26 to allow the purge gas 28 to effectively flow between the wafers to thoroughly purge air therebetween. For this reason, the gas exiting orifices 26 are disposed with increased effect at higher levels than the spouts 25 of the inert gas chamber 24. Reference character 21 designates waste mixed gas of air, reaction gas, diffusion gas and inert gas.

Figure 5:
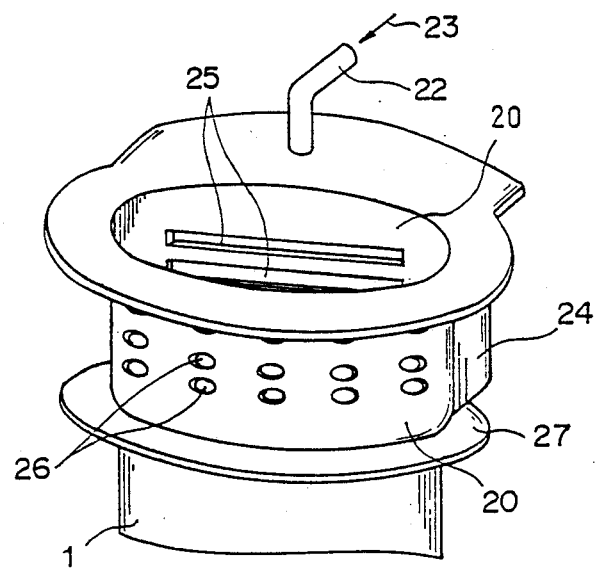
FIG. 5 is a perspective view of the cylindrical partition for obvious illustration thereof, and FIGS. 6A and B are arrangement patterns of inert gas spouts.
Figure 6:
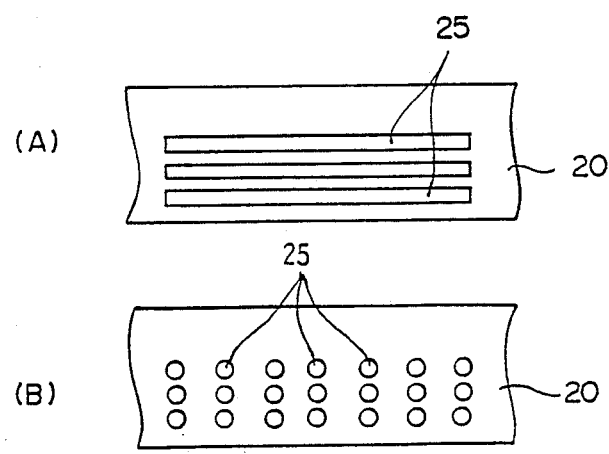

The partition 20 and the adjoining inert gas chamber 24, as obviously illustrated as to contour in FIG. 5 are provided with inert gas spouts 25, which may be of slit or small circular shape shown in FIG. 6. Furthermore the disposition of the cylindrical partition 20 on the flange 27 of the core tube 1 contributes to preventing particles giving off between the flange 27 and heater 2 from depositing onto the wafers.

As described above, the scavenger 6 in this embodiment is installed with a cylindrical partition 20 through which semiconductor wafers 3 are conveyed and the adjoining inert gas chamber 24 for injecting the introduced inert gas in the form of air curtain, this, in cooperation with the gas exiting orifices 26 on the opposite side, permitting air between the arrayed wafers to be purged therefrom and instead inert gas to fill therebetween, with effect to prevent air from invading into the diffuser main. Thus the invasion as of outside air which would cause lessening of performance can be well prevented. In addition, the cylindrical partition 20 and the inert gas chamber 24 are made of transparent highly pure quartz, therefore without undergoing rise in temperature due to radiation from the heater 2, and in turn without giving radiant heat to wafers, and thus replacement at relatively lower temperatures, of air between wafers with inert gas can be realized. Besides, at the withdrawal of wafers, likewise radiation from the heated wafers passes through 20 & 24 without reflecting from them, and is dispersed. This contributes to increase in cooling effect of inert gas curtain. Accordingly the wafers can be withdrawn at correspondingly-lowered temperature from the scavenger.

It will be evident that various modifications can be made to the described embodiments without departing from the scope of the present invention.

For example, instead of the above-mentioned cylindrical partition 20 having circular section, that of elliptical or square section is useful. The inert gas chamber 24 may be provided with spouts 25 different in shape and/or number from the above-mentioned. The injection direction of inert gas 23 is not always restricted to horizontal but may be angled, for example, at similar degree to the tilt where the wafers are positioned. The arranged spouts or slits may be formed to be angled. The invention is useful not only for vertical type diffuser with the opening of the core tube positioned at top but also for that with the opening positioned at bottom. It is applicable to other (not diffuser) heat-treatment furnaces or of course, also to horizontal type furnaces though vertical type is described above.

The apparatus according to the present invention, as described above, has the features and advantages brought thereby that there is provided a cylindrical partition engaging fittedly on the opening of the core tube and inert gas is injected into the cylindrical partition on one side of it and flows out of it on the other side, with effects of purging air between the arrayed semiconductors and instead inert gas fills therebetween with inert gas, and of preventing air from invading into the furnace, thus of satisfactorily preventing lessening in performance due to invasion as of outside air.

What is claimed is:

1. A semiconductor heat-treating apparatus comprising: a main heat treatment furnace including a port for carrying semiconductors into and out of said main furnace, a first chamber engaging and fitted around said port for semiconductors, the first chamber comprising a perforated wall for supplying and withdrawing gas, a second chamber including a partial partition mounted on one side of the perforated wall opposite the port and a conduit for supplying inert gas into said second chamber and into the first chamber from the second chamber via the perforated wall, and a gas system for discharging gases from said first and second chambers.

2. The apparatus according to claim 1 wherein said gas system comprises a box enclosing the first and second chambers and having on one side a plurality of gas injecting apertures for injecting gas and having on its opposite side, gas exiting apertures.

3. The apparatus according to claim 2 wherein inert gas is injected through said conduit, second chamber, and perforations to form an inert gas curtain at the port and passes together with gas from said gas injecting apertures, out of said gas exiting 4. The apparatus according to claim 1 wherein said inert gas is supplied to said port concurrently with gas in said gas system.

5. The apparatus according to claim 2 wherein said gas system is provided with, on one side a gas inlet and on an opposite side, an outlet for discharging gases including said inert gas.

6. The apparatus according to claim 2 wherein perforations of said perforated wall opposite said second chamber are disposed at higher levels than perforations of said perforated wall adjacent to said second chamber.

7. The apparatus according to claim 1 wherein said partial partition is made of transparent material.

* * * * *